United States Patent [19]

Nishiyama et al.

[11] 4,205,117

[45] * May 27, 1980

[54] PIEZOELECTRIC CRYSTALLINE FILM OF ZINC OXIDE AND METHOD FOR MAKING SAME

[75] Inventors: Hiroshi Nishiyama, Mukou; Toshio Ogawa; Tasuku Mashio, both of Nagaokakyo, all of Japan

[73] Assignee: Murata Manufacturing Co., Ltd., Kyoto, Japan

[*] Notice: The portion of the term of this patent subsequent to Jan. 8, 1997, has been disclaimed.

[21] Appl. No.: 940,335

[22] Filed: Sep. 7, 1978

[30] Foreign Application Priority Data

Sep. 13, 1977 [JP] Japan .................................. 52-110892

[51] Int. Cl.$^2$ ........................ C23C 13/00; C04B 35/00
[52] U.S. Cl. .............................. 428/411; 204/192 SP; 252/62.9; 427/100; 428/432; 428/469; 428/492; 428/539
[58] Field of Search ................. 204/192 SP; 252/62.9; 427/100; 428/426, 432, 457, 469, 492, 539

[56] References Cited

U.S. PATENT DOCUMENTS

| | | | |
|---|---|---|---|
| 3,420,763 | 1/1969 | Polito et al. | 204/192 SP |
| 3,573,960 | 4/1971 | Duncan | 204/192 SP |
| 3,766,041 | 10/1973 | Wasa et al. | 204/192 SP |
| 3,988,232 | 10/1976 | Wasa et al. | 204/192 SP |

*Primary Examiner*—Jack Cooper
*Attorney, Agent, or Firm*—Birch, Stewart, Kolasch & Birch

[57] ABSTRACT

Piezoelectric crystalline film on a substrate, which is a crystalline zinc oxide film with a c-axis substantially perpendicular to the substrate surface, the crystalline zinc oxide film containing, as an additive element, phosphorus. The piezoelectric crystalline films have high resistivity and a smooth surface, and make it possible to produce piezoelectric transducers with good conversion efficiency. Such films are made by sputtering zinc oxide and phosphorus onto a substrate from a film material source consisting essentially of a ceramic of zinc oxide containing phosphorus.

4 Claims, 3 Drawing Figures

10μ

10μ

PIEZOELECTRIC CRYSTALLINE FILM OF ZINC OXIDE AND METHOD FOR MAKING SAME

BACKGROUND AND SUMMARY OF THE INVENTION

The present invention relates to piezoelectric crystalline films. More particularly, it relates to piezoelectric crystalline films comprising zinc oxide having a hexagonal crystal structure and a method for making the same.

There are many methods for making piezoelectric crystalline zinc oxide films such as, for example, vacuum deposition methods, epitaxial growth methods, sputtering methods, and ion plating methods. Among these methods, the sputtering methods, particularly, the radio-frequency sputtering method has been used very often recently because it has the advantage that a high growth rate of the oriented crystalline films is possible, thus making it possible to mass-produce piezoelectric crystalline films, industrially.

When making a piezoelectric crystalline film of zinc oxide on a substrate surface by the radio-frequency sputtering method, a ceramic of highly pure zinc oxide has been conventionally used as a source of the film material. However, even when radio-frequency sputtering is effected with such a film material source, it results in the formation of a crystalline film which is poor in the adhesion to a substrate and low in the quality. In addition, it is difficult with such a film material source to make a piezoelectric crystalline film with a c-axis perpendicular to the substrate surface. If a piezoelectric crystalline film of zinc oxide has poor adhesion, various disadvantages occur. For example, when manufacturing an acoustic surface wave filter with such a zinc oxide film, it is difficult to form interdigital transducers on the film surface, and the produced acoustic surface wave filter tends to have the disconnection of interdigital transducers, and possesses a large propagation loss of acoustic surface waves. Also, if the c-axis of the zinc oxide film is inclined with respect to the axis perpendicular to the substrate surface, the electromechanical coupling factor is lowered, thus making it difficult to produce a piezoelectric crystalline film transducer with good conversion efficiency.

It has now been found that the incorporation of phosphorus into a zinc oxide film makes it possible to produce a piezoelectric crystalline film with a c-axis perpendicular to the substrate surface and with high quality.

It is an object of the present invention to provide an improved zinc oxide piezoelectric crystalline film which overcomes the aforesaid disadvantages.

Another object of the present invention is to provide a method for making such improved piezoelectric crystalline films.

According to the present invention, there is provided a piezoelectric crystalline film on a substrate, the film being a crystalline zinc oxide film with a hexagonal crystal structure and a c-axis substantially perpendicular to the substrate surface, characterized in that said zinc oxide film contains phosphorus.

Since the content of phosphorus has great influence on the electrical and physical properties of the films, it is preferred to limit its content to the range of from 0.01 to 20.0 atomic percent when converted into the percentage of phosphorus atoms. Because, if the content of phosphorus is less than 0.01 atomic percent, the film changes for the worse in its quality and adhesion, and if the content of phosphorus is more than 20.0 atomic percent, the direction of the crystallographic orientation of the film can not be well controlled, resulting in a worsening of the orientation of the piezoelectric crystalline film.

As a material for the substrate on which a piezoelectric crystalline film is formed, there may be used those such as, for example, metal, glass, ceramics, single crystal, resins, rubber and the like.

The piezoelectric crystalline film of the present invention has a c-axis substantially perpendicular to the substrate surface, thus making it possible to produce piezoelectric transducers with good conversion efficiency. Further, the piezoelectric crystalline films of the present invention have high resistivity and good adhesion, and a smooth surface.

The piezoelectric crystalline film of the present invention may be made by any sputtering method such as the radio-frequency sputtering method, and the co-sputtering method. A preferred method for making piezoelectric crystalline films according to the present invention comprises sputtering zinc oxide and phosphorus onto a surface of a substrate to form a crystalline zinc oxide film with a hexagonal crystal structure and a c-axis substantially perpendicular to the substrate surface, said sputtering being effected by using a film material source consisting essentially of a ceramic of zinc oxide containing 0.01 to 20.0 atomic percent of phosphorus.

The present invention will be further apparent from the following description with respect to examples and the accompanying drawings, in which.

Figure 1:
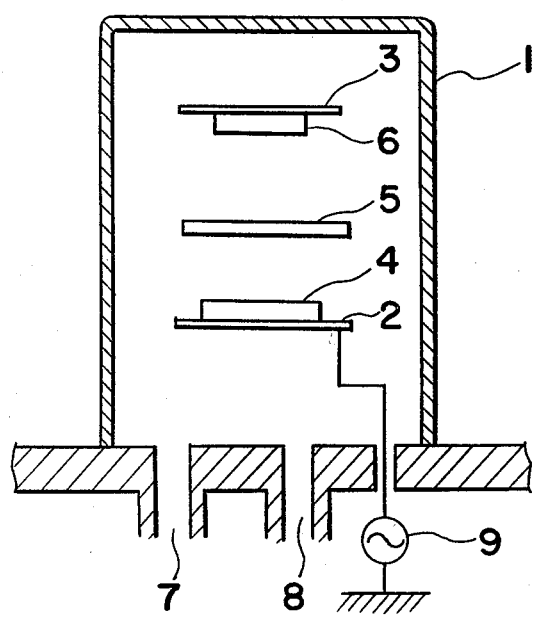
FIG. 1 is a diagrammatic view of a radio-frequency sputtering apparatus for making piezoelectric crystalline films.

Referring now to FIG. 1, there is shown a radio-frequency sputtering apparatus with two electrodes which is used for making piezoelectric crystalline films according to the present invention. The apparatus comprises a bell jar 1 in which a pair of electrodes, i.e., a planar cathode 2 and a planar anode 3 are positioned in parallel. Fixed on the cathode 2 is a film material source 4 consisting essentially of a ceramic of zinc oxide containing phosphorus. A shutter 5 is positioned between electrodes 2 and 3. A substrate 6 consisting of, for example, glass or metal is fixed to the bottom of the anode 3 so as to sit opposite to the film material source. The substrate 6 is heated to a temperature in the range of 20° C. to 600° C. during sputtering. A vent 7 and a gas inlet 8 are provided in the bell jar 1.

The radio-frequency sputtering is effected in the following manner: After making it airtight, the bell jar 1 is evacuated through the vent 7 to a vacuum of more than $1 \times 10^{-6}$ Torr, and then supplied with argon or oxygen gas or a mixed gas of argon and oxygen through the gas inlet 8 thereby adjusting the pressure in the bell jar 1 to $1 \times 10^{-1}$ to $1 \times 10^{-4}$ Torr. A radio-frequency voltage is applied between the cathode 2 and the bell jar 1 by a radio-frequency electric power source 9. Electric power of 2 to 8 $W/cm^2$ is supplied to the film material source 4.

The film material source consisting essentially of a ceramic of zinc oxide containing phosphorus is prepared in the following manner:

Using powder of ZnO, and $Zn_3(PO_4)_2.4H_2O$ as raw materials, there are prepared mixtures to produce ceramics of zinc oxide each having a compositional proportion as shown in Table 1. Each of the mixtures is milled by the wet process, dried and then calcined at 600° to 800° C. for 2 hours. The presintered body obtained is crushed, milled by the wet process with an organic binder and then dried. The resultant powder is shaped into discs with a diameter of 100 mm and a thickness of 5 mm at a pressure of 1000 kg/cm² and then fired at 1200° C. for 2 hours to obtain film material sources.

The thus obtained film material sources were subjected to measurement of resistivity and percentage of bulk density $d_s$ to the theoretical density $d_t (d_s/d_t \times 100)$. The results are shown in Table 1.

Table 1

| Specimen No. | Additive (atomic %) P | Film material source Resistivity ($\Omega \cdot cm$) | $(d_s/d_t)$ $\times 100$ (%) | Piezoelectric crystalline film of zinc oxide Orientation X | $\delta$ | Resistivity ($\Omega \cdot cm$) | Quality | Adhesion |
|---|---|---|---|---|---|---|---|---|
| 1 | — | $8.6 \times 10$ | 85.0 | 5.8 | 5.5 | $3.5 \times 10^3$ | rough | bad |
| 2 | 0.0005 | $1.1 \times 10^2$ | 87.0 | 2.2 | 2.7 | $7.8 \times 10^6$ | rough | bad |
| 3 | 0.05 | $3.2 \times 10^3$ | 95.5 | 1.1 | 1.9 | $3.9 \times 10^7$ | smooth | good |
| 4 | 0.1 | $4.7 \times 10^4$ | 97.8 | 0.5 | 2.6 | $2.5 \times 10^8$ | smooth | good |
| 5 | 5.0 | $5.6 \times 10^7$ | 99.1 | 3.6 | 3.8 | $1.3 \times 10^9$ | smooth | good |
| 6 | 15.0 | $7.2 \times 10^8$ | 98.5 | 4.2 | 5.2 | $4.7 \times 10^8$ | smooth | good |
| 7 | 25.0 | $6.3 \times 10^9$ | 98.3 | — | — | — | — | — |

Using the respective film material sources, piezoelectric crystalline zinc oxide films containing phosphorus are made on glass substrates with the aforesaid radio-frequency sputtering apparatus. The radio-frequency sputtering is carried out under the following conditions: A mixed gas of 90 vol % of argon and 10 vol % of oxygen is supplied to the bell jar 1 through the gas inlet 8, thereby adjusting the pressure in the bell jar 1 to $2 \times 10^{-3}$ Torr. The glass substrate is heated to and maintained at 350° C. The film material source 4 is supplied with 6 W/cm² of electric power with a frequency of 13.56 MHz.

The c-axis orientation of the thus obtained piezoelectric crystalline films was measured with a locking curve method by X-ray diffraction (Ref.: Minakata, Chubachi and Kikuchi "Quantitative Representation of c-axis Orientation of Zinc Oxide Piezoelectric Thin Films" The 20th Lecture of Applied Physics Federation (Japan), vol. 2 (1973) page 84; and Makoto Minakata, The Tohoku University Doctor's Thesis (1974)). The mean value ($\overline{X}$) and standard deviation ($\sigma$) of the angle of the c-axis with respect to the axis perpendicular to the substrate surface were obtained from respective specimens. The results of the measurement of the adhesion of the film to the substrate are also shown in Table 1. The experiment to determine whether or not the film has sufficient adhesive force was carried out by the thermal shock test method 107C of MIL-STD-202D. A film which peeled off from the surface of the substrate was judged as "bad" and, a film in which cracks were produced was judged as "passable", and a film which showed no change was judged as "good".

As is evident from Table 1, the crystalline films of the present invention have a c-axis substantially perpendicular to the substrate surface, from which it will be understood that the piezoelectric crystalline films of the present invention possess a large electromechanical coupling factor, i.e., good conversion efficiency. Further, the piezoelectric crystalline films of the present invention are smooth, and have good adhesion to the substrate and very high resistivity.

Figure 2:
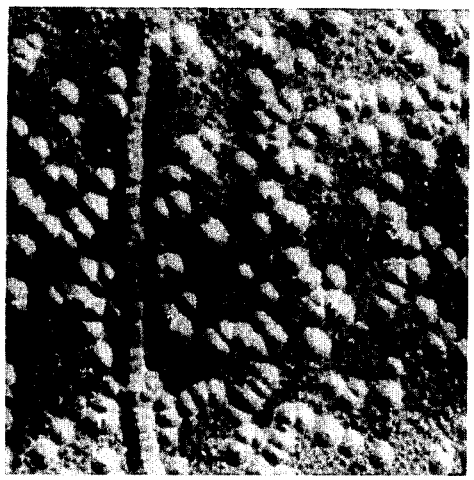
FIG. 2 is an electron micrograph of a conventional zinc oxide film.

Specimens Nos. 1 and 3 were photographed through a scanning electron microscope at a magnification of 1000. FIG. 2 is an electron micrograph of the specimen No. 1 and FIG. 3 is that of the specimen No. 3.

Figure 3:
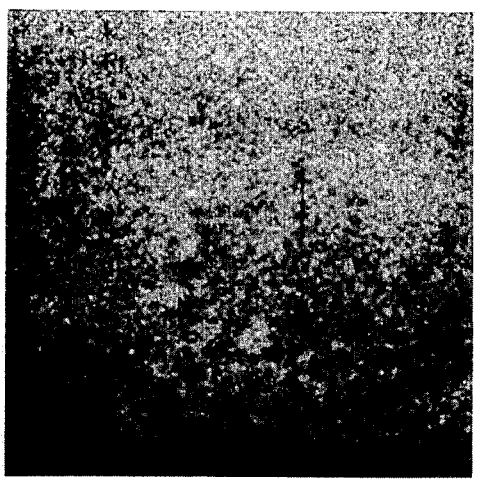
FIG. 3 is an electron micrograph of a zinc oxide film of the present invention.

As is evident from these figures, the conventional piezoelectric crystalline films possess a rough surface (cf. FIG. 2), while the piezoelectric crystalline films of the present invention possess a smooth surface (cf. FIG. 3).

In the above examples, zinc phosphate tetrahydrate is used as a source of phosphorus for making ceramics of zinc oxide containing P, but any other compound of phosphorus may be employed as a source material.

The use of a film material source containing phosphorus has its own advantages, as follows.

When mass-producing piezoelectric crystalline films industrially by the radio-frequency sputtering method, it is necessary to increase the crystal growth rate as much as possible. To do this, the electric power supplied to the film material source per unit area thereof is increased with the result that the film material source is required to have a high bulk density. This requirement is fully satisfied by the sources containing phosphorus. As is evident from Table 1, these film material sources have a bulk density higher than that of the conventionally used sources. Thus, the film material sources containing phosphorus make it possible to mass-produce zinc oxide piezoelectric crystalline films by the use of high electric powers.

What we claim is:

1. A piezoelectric crystalline film disposed on a substrate, said film consisting essentially of a crystalline zinc oxide film with a hexagonal crystal structure and a c-axis substantially perpendicular to the substrate surface, said crystalline zinc oxide film containing 0.01 to 20.0 atomic percent of phosphorus.

2. The piezoelectric crystalline film of claim 1 wherein said substrate is made of a material selected from the group consisting of metal, glass, ceramics, single crystals, resins and rubber.

3. A method for making piezoelectric crystalline films comprising simultaneously sputtering zinc oxide and phosphorus from a film material source onto a substrate to form a crystalline zinc oxide film with a hexagonal crystal structure and a c-axis substantially perpendicular to the substrate surface containing 0.01 to 20.0 atomic percent of phosphorus, wherein said sputtering is effected by radio-frequency sputtering in an atmosphere of argon, or oxygen, or a mixture of argon and oxygen under a pressure of $1 \times 10^{-1}$ to $1 \times 10^{-4}$ Torr, and wherein said film material source consists essentially of a ceramic of zinc oxide containing 0.01 to 20.0 atomic percent of phosphorus, said substrate being positioned on an anode placed in parallel with a cathode on which said film material source is positioned, said film material source being supplied with an electric power of 2 to 8 W/cm².

4. The method for making piezoelectric crystalline films according to claim 3 wherein the substrate is maintained at a temperature in the range of 20° C. to 600° C. during sputtering.

* * * * *